(12) United States Patent
Peng et al.

(10) Patent No.: US 11,379,714 B2
(45) Date of Patent: Jul. 5, 2022

(54) ARCHITECTURE OF IN-MEMORY COMPUTING MEMORY DEVICE FOR USE IN ARTIFICIAL NEURON

(71) Applicant: British Cayman Islands Intelligo Technology Inc., Grand Cayman (KY)

(72) Inventors: Chi-Wei Peng, Zhubei (TW);
Wei-Hsiang Tseng, Zhubei (TW);
Hong-Ching Chen, Zhubei (TW);
Shen-Jui Huang, Zhubei (TW);
Meng-Hsun Wen, Zhubei (TW);
Yu-Pao Tsai, Zhubei (TW); Hsuan-Yi Hou, Zhubei (TW); Ching-Hao Yu, Zhubei (TW); Tsung-Liang Chen, Zhubei (TW)

(73) Assignee: BRITISH CAYMAN ISLANDS INTELLIGO TECHNOLOGY INC., Grand Cayman (KY)

( * ) Notice: Subject to any disclaimer, the term of this patent is extended or adjusted under 35 U.S.C. 154(b) by 634 days.

(21) Appl. No.: 16/425,244

(22) Filed: May 29, 2019

(65) Prior Publication Data
US 2019/0370640 A1    Dec. 5, 2019

Related U.S. Application Data

(60) Provisional application No. 62/728,753, filed on Sep. 8, 2018, provisional application No. 62/677,189, filed on May 29, 2018.

(51) Int. Cl.
*G06N 3/06* (2006.01)
*G11C 11/41* (2006.01)
(Continued)

(52) U.S. Cl.
CPC ............ *G06N 3/063* (2013.01); *G11C 11/413* (2013.01); *H03M 1/822* (2013.01)

(58) Field of Classification Search
CPC .... G06N 3/063; G06N 3/0635; G11C 11/413; G11C 7/1006; G11C 11/419; G11C 11/05; G11C 11/412; H03M 1/822
See application file for complete search history.

(56) References Cited

U.S. PATENT DOCUMENTS

2018/0082176 A1    3/2018  Wu et al.
2020/0372330 A1*  11/2020  Chang ................. H01L 27/2463

FOREIGN PATENT DOCUMENTS

CN      104240753 A    12/2014
CN      107194462 A     9/2017
(Continued)

OTHER PUBLICATIONS

R. Liu et al., "Parallelizing SRAM Arrays with Customized Bit-Cell for Binary Neural Networks," 2018 55th ACM/ESDA/IEEE Design Automation Conference (DAC), 2018, pp. 1-6, doi: 10.1109/DAC.2018.8465935. (Year: 2018).*

(Continued)

*Primary Examiner* — Ajay Ojha
(74) *Attorney, Agent, or Firm* — Muncy, Geissler, Olds & Lowe, P.C.

(57) ABSTRACT

An in-memory computing memory device is disclosed. The memory device comprises an array of memory cells, a plurality of word lines, a plurality of bit lines, (M+1) input circuits, a wordline driver and an evaluation circuitry. The array is divided into (M+1) lanes and each lane comprises P memory cell columns and an input circuit. The input circuit in each lane charges a predefined bit line with a default amount of charge proportional to an input synapse value and then distributes the default amount of charge to the other second bit lines with a predefined ratio based on a constant current. The evaluation circuitry couples a selected number of the bit lines to an accumulate line and convert an average (Continued)

voltage at the accumulate line into a digital value in response to a set of (M+1) input synapse values and the activated word line.

21 Claims, 13 Drawing Sheets

(51) Int. Cl.
*G06N 3/063* (2006.01)
*G11C 11/413* (2006.01)
*H03M 1/82* (2006.01)

(56) References Cited

FOREIGN PATENT DOCUMENTS

| | | |
|---|---|---|
| CN | 108053848 A | 5/2018 |
| EP | 2 814 036 A2 | 12/2014 |
| TW | 201128542 A | 8/2011 |

OTHER PUBLICATIONS

P. Chen and S. Yu, "Partition SRAM and RRAM based synaptic arrays for neuro-inspired computing," 2016 IEEE International Symposium on Circuits and Systems (ISCAS), 2016, pp. 2310-2313, doi: 10.1109/ISCAS.2016.7539046. (Year: 2016).*
TW Office Action issued in Application No. 1092029102001 dated Mar. 30, 2020.

\* cited by examiner

ARCHITECTURE OF IN-MEMORY COMPUTING MEMORY DEVICE FOR USE IN ARTIFICIAL NEURON

CROSS-REFERENCE TO RELATED APPLICATION

This application claims priority under 35 USC 119(e) to U.S. provisional application No. 62/677,189, filed on May 29, 2018, the content of which is incorporated herein by reference in its entirety. This application also claims priority under 35 USC 119(e) to U.S. provisional application No. 62/728,753, filed on Sep. 8, 2018, the content of which is incorporated herein by reference in its entirety.

BACKGROUND OF THE INVENTION

Field of the Invention

The invention relates to in-memory computing (IMC), and more particularly, to the architecture of IMC memory device suitable for use in artificial neurons.

Description of the Related Art

An artificial neural network (ANN) is based on a collection of connected neurons. When processing and propagating input signals, the input values (hereinafter called "synapse values") supplied to the neuron's synapses are each modulated by the synapses' respective weight values. The effect of this process is to pass a portion of the synapse value through the synapse, which is proportional to the weight value. In this way, the weight value modulates the connection strength of the synapse. The result is then summed with the other similarly processed synapse values. Respective neurons receive the weighted input from the neuron in the previous stage and calculate the sum of the products. A propagation function for each neuron can be described mathematically as follows: $r=\Sigma_{i=0}^{M} W_i * X_i$ where r is the output value of a given neuron's propagation function, "Xi" is the synapse value supplied/inputted to the neuron's synapse i, $W_i$ is the weight value for modulating the synapse value at the neuron's synapse i, and the total number of the neuron's synapses is (M+1).

At present, neural networks are often executed by simulation software, using personal computers. However, as the size of the network increases, the software becomes more complex and the processing time increases. On the other hand, the drop in RAM prices in the current market contributes to the increasing popularity of in-memory computing technology. This has made in-memory computing economical among a wide variety of applications. In-memory computing (IMC) stores data in RAM instead of hard disks. This eliminates the I/O requirements and speeds data access because RAM-stored data is available instantaneously, while data stored on disks is limited by disk speeds. RAM storage and parallelization are two key features of IMC. The Applicant is making use of this technology in the artificial neural network.

What is needed is an IMC memory device capable of being parallel accessed and processing at high speed and with low power consumption.

SUMMARY OF THE INVENTION

In view of the above-mentioned problems, an object of the invention is to provide an in-memory computing (IMC) memory device using a digital DAC-bias loop to provide a constant current source and a voltage bias of the constant current source, eliminating the need of an analog bandgap circuit.

One embodiment of the invention provides an in-memory computing (IMC) memory device. The IMC memory device comprises an array of memory cells, a plurality of first word lines, a plurality of first bit lines, (M+1) input circuits, a first wordline driver and an evaluation circuitry. The array of memory cells is arranged in rows and columns and vertically divided into (M+1) lanes. The first word lines are arranged corresponding to the respective memory cell rows, each connected to the memory cells in a corresponding row. The first bit lines are arranged corresponding to the respective memory cell columns, each connected to the memory cells in a corresponding column. The (M+1) input circuits have (M+1) data input terminals and are coupled to the first bit lines. Each lane comprises P memory cell columns and a corresponding input circuit. P memory cells in each row for each lane stores a weight value $W_i$. The input circuit in each lane charges a predefined first bit line with a default amount of charge proportional to an input synapse value $X_i$ at its data input terminal and then distributes the default amount of charge to the other second bit lines with a predefined ratio based on a constant current. The first wordline driver activates one of the first word lines to retain a final amount of charge in each first bit line that is equivalent to a first product of its distributed amount of charge and a bit value stored in its corresponding memory cell. The evaluation circuitry is configured to selectively couple a selected number of the first bit lines to an accumulate line and convert an average voltage at the accumulate line into a digital value in response to a set of (M+1) input synapse values at the (M+1) data input terminals and the activated first word line. The average voltage is associated with the accumulation of the final amount of charge in each selected first bit line.

Another embodiment of the invention provides an in-memory computing memory block applied in an artificial neuron. The memory block comprises Q1 in-memory computing (IMC) memory devices that are arranged in a matrix of Q2 rows and Q3 columns, where Q1>1, Q2>0 and Q3>0.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

As used herein and in the claims, the term "and/or" includes any and all combinations of one or more of the associated listed items. The use of the terms "a" and "an" and "the" and similar referents in the context of describing the invention are to be construed to cover both the singular and the plural, unless otherwise indicated herein or clearly contradicted by context.

A feature of the invention is to use a digital DAC-bias loop to provide a constant current source $I_{DAC1}$ and a voltage bias $V_{ibias}$ of the constant current source $I_{DAC1}$, eliminating the need of an analog bandgap circuit. Another feature of the invention is to charge a predefined computing bit line XB in each lane to the amount of charge $Q_i$ by a DAC that generates a time-based signal XON with a pulse width (PW) (or pulse on period). Here, the amount of charge Qi and the pulse width are proportional to its input data (i.e., synapse value) $X_i$. Another feature of the invention is to use a charge sharing mechanism to distribute the amount of charge Qi to the other computing bit lines in the corresponding lane with a binary-weighted ratio, a uniform weighted ratio or a hybrid ratio. Another feature of the invention is that an access to the memory cells for reading and writing is able to be conducted concurrently with an access to the memory cells for IMC operations due to dedicated computing word lines, dedicated computing bit lines and a dedicated output port ($Y_{out}$). Another feature of the invention is that the bit length of the weight values $W_i$ is adjustable according to a charge weighting ratio of the computing bit lines in each lane, with which the charge sharing mechanism distributes the amount of charge Qi among the computing bit lines. Another feature of the invention is that an output voltage of the DAC 190 is adjustable according to the bit length of the weight values $W_i$.

Figure 1A:
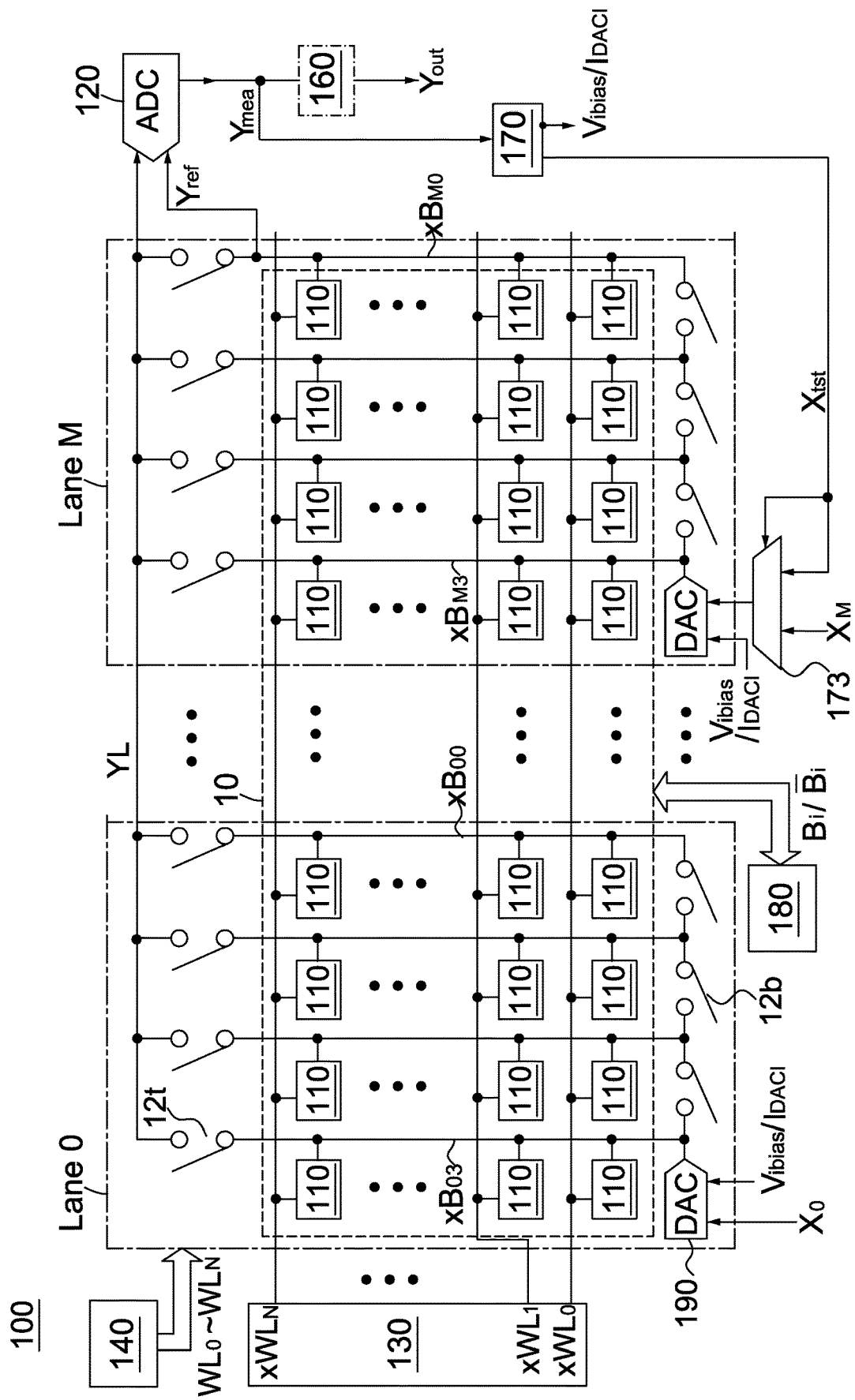
FIG. 1A is a schematic diagram showing an IMC SRAM device according to an embodiment of the invention.
Figure 1B:
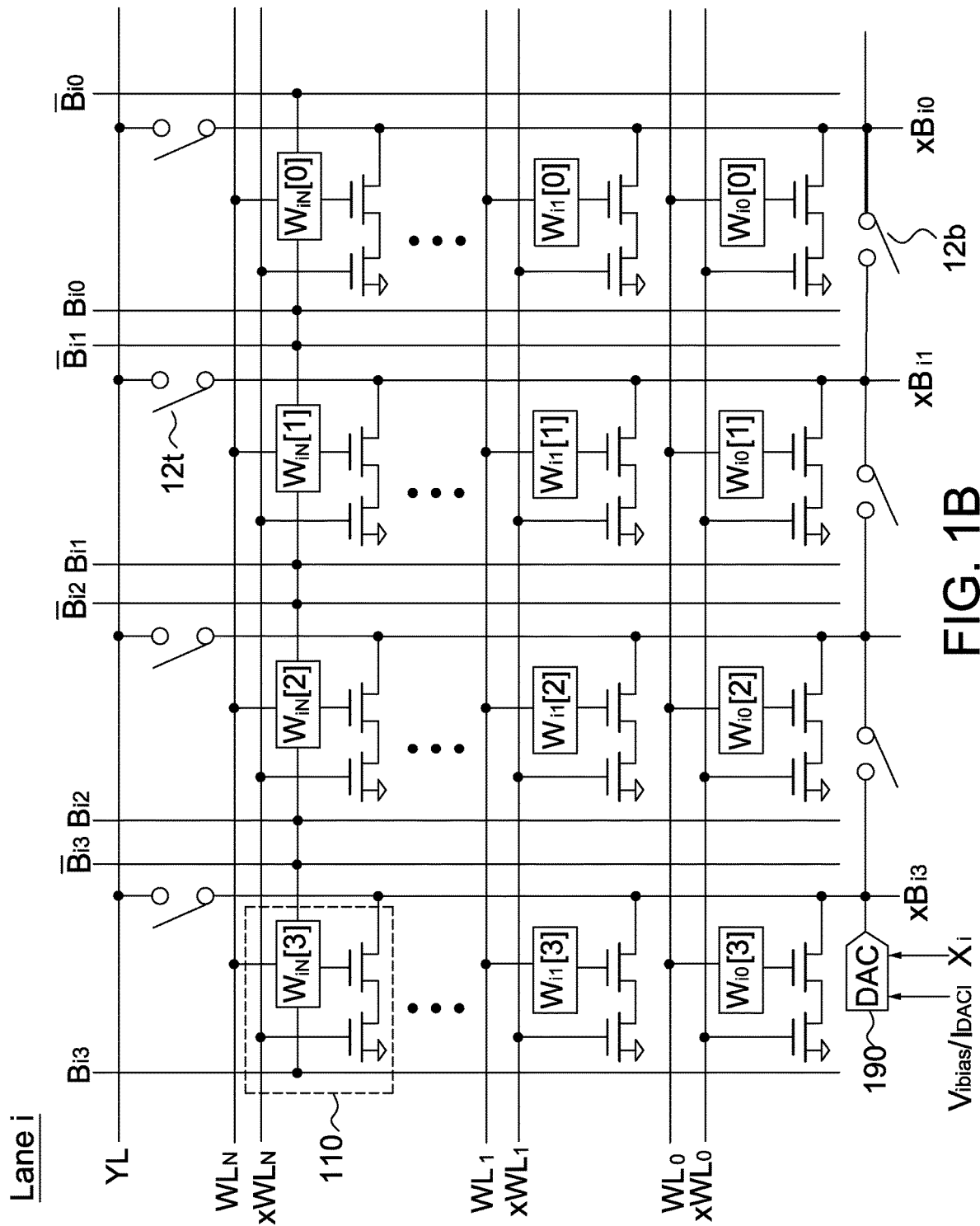
FIG. 1B is an enlarged view of Lane i in FIG. 1A.

FIG. 1A is a schematic diagram showing an IMC SRAM device according to an embodiment of the invention. Referring to FIG. 1A, an IMC SRAM device 100 of the invention, suitable for use in artificial neurons, includes a SRAM array 10, an analog to digital converter (ADC) 120, a computing wordline driver 130, a wordline driver 140, an accumulation circuit 160, a voltage/current adjusting circuit 170, a column peripheral circuit 180 and M digital to analog converters (DACs) 190. The SRAM array 10 is used to store (N+1) groups/rows of coefficients (i.e., weight values) and there are (M+1) coefficients in each group/row of coefficients. In FIGS. 1A and 1B, four SRAM cells 110 in each row of each lane store a coefficient $W_i$. It should be noted that storing one coefficient $W_i$ in the four SRAM cells 110 in each row of each lane is provided by way of example and not limitations of the invention. In an alternative embodiment, the number of SRAM cells 110 in each row of each lane storing a corresponding coefficient $W_i$ may be two, six, eight, or sixteen. For purposes of clarity and ease of description, hereinafter, the following embodiments and examples are described with the assumption that four SRAM cells 110 in each row in each lane store a corresponding coefficient $W_i$.

The SRAM array 10 includes (M+1)×4×(N+1) SRAM cells 110 organized in a matrix of columns and rows with (N+1) word lines ($WL_j$), (N+1) computing word lines ($xWL_j$), (M+1)×4 bit line pairs ($B_{ik}$, $/B_{ik}$) and (M+1)×4 computing bit lines ($xB_{ik}$), where 0<=i<=M, 0<=j<=N, and 0<=k<=3. For ease of illustration, however, only several computing word lines and several computing bit lines are illustrated in the SRAM array 10 of FIG. 1A. The column peripheral circuit 180 controls selecting the column of the SRAM array 10 for reading and writing the coefficients. The column peripheral circuit 180 may include, without limitation, pre-charge circuitry, write drivers, read drivers and sense amplifiers. The computing wordline driver 130 activates a computing word line ($xWL_j$) for activating group/ row j of coefficients to compute the result of a given neuron's propagation function ($\Sigma_{i=0}^{M} W_i * X_i$) based on a first address signal (not shown). The wordline driver 140 activates a word line ($WL_n$) for reading the coefficients from or writing the coefficients to the SRAM array 10 based on a second address signal (not shown), where 0<=n<=N. Due to dedicated computing word lines, dedicated computing bit lines and a dedicated output port ($Y_{out}$), the invention allows a concurrent SRAM and IMC access, i.e., an access to the memory cells for reading and writing able to be conducted concurrently with an access to the memory cells for IMC operations (i.e., computing the result of the propagation function).

The IMC SRAM device 100 may be a memory component for an associated microprocessor, digital signal processor (DSP), application-specific integrated circuit (ASIC) or larger electronic apparatus. Signal paths and a data interface of the associated apparatus may be coupled to the computing wordline driver 130, the wordline driver 140 and the column peripheral circuit 180 of the IMC SRAM device 100 to send address information and retrieve/send data for reading/ writing the coefficients to the SRAM cells 110 and for computing the result of the propagation function. Those who skilled in the art will understand coupling of the IMC SRAM device 100 to the associated apparatus.

Figure 1C:
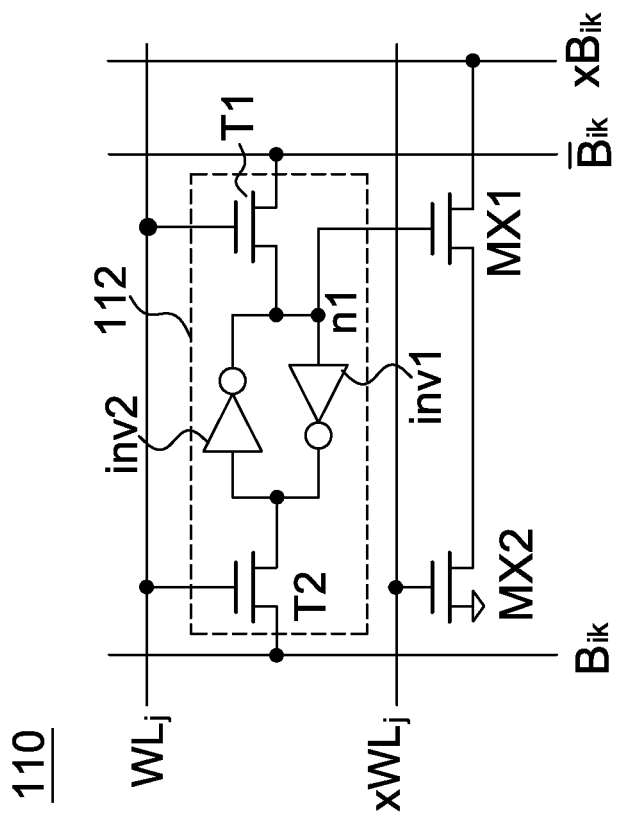
FIG. 1C is a circuit diagram showing a SRAM cell 110 according to an embodiment of the invention.

Since four SRAM cells 110 in each row of each lane store a coefficient $W_i$, the SRAM array 10 is divided into (M+1) lanes, each lane having four columns of SRAM cells 110, a digital-to-analog converter (DAC) 190, four computing bit lines, four bit line pairs, four switches 12$t$ and three switches 12$b$, as shown in FIG. 1B. FIG. 1B is an enlarged view of Lane i in FIG. 1A. FIG. 1C is a circuit diagram showing a SRAM cell 110 according to an embodiment of the invention. Referring to FIG. 1C, a SRAM cell 110 of the invention includes a six-transistor (6T) SRAM cell 112 (including two inverters inv1 and inv2 and two transistors T1 and T2) and two transistors MX1 and MX2. The 6T SRAM cell 112 is a traditional SRAM cell, so the read/write operations of the 6T SRAM cell 112 are omitted herein for the sake of brevity. The 6T SRAM cell 112 is implemented by a 1-port 6T or dual-port 6T SRAM cell. In one embodiment, the 6T SRAM cell 112 is replaced with an 8T SRAM cell. In an alternative embodiment, the 6T SRAM cell 112 is replaced with a 10T SRAM cell. Please note that the 6T SRAM cell 112 is an example of a memory cell. The memory cell can be a bitcell in accordance with any of a variety of different technologies.

Referring to FIGS. 1B and 1C, each 6T SRAM cell 112 is used to store the value $W_{ij}[k]$ of a bit with number k in a coefficient $W_{ij}$, where $0<=k<=3$, i denotes a lane number and j denotes a row number in the SRAM array 10. The transistor MX2 is connected between the transistor MX1 and the ground node, and its gate is connected to a corresponding computing word line $xWL_j$. The transistor MX1 is connected between a corresponding computing bit line $xB_{ik}$ and the transistor MX2, and its gate is connected to an output node n1 of a latch formed by the two cross-coupled inverters inv1 and inv2. The two transistors MX1 and MX2 are used to discharge the capacitor $C_{xB}$ (not shown) of the computing bit line $xB_{ik}$, which evaluates the product of $W_{ij}[k]$ and $Q_i[k]$, where $Q_i[k]$ denotes the amount of charge in the capacitor $C_{xB}$ (not shown) of the computing bit line $xB_{ik}$. For example, if a computing word line (e.g., $xWL_1$) is asserted/activated by the computing wordline driver 130 and the synapse values $X_i$ are inputted to the SRAM array 10, group/row 1 of coefficients is selected to compute the result of the propagation function; if the value $W_{i1}[k]$ in a 6T SRAM cell 112 is equal to 0, its transistors MX1 and MX2 discharge the capacitor $C_{xB}$ of the computing bit line $xB_{ik}$ to the ground; otherwise, the computing bit line $xB_{ik}$ retains the amount of charge $Q_i[k]$ in its capacitor $C_{xB}$. Asserting/activating the computing word line $xWL_1$ is equivalent to evaluating the product of $W_{i1}[k]$ and $Q_i[k]$ for group 1 of coefficients. In FIG. 1A, in a normal mode, $(M+1) \times 4$ control signals $AE_{ik}$ are applied to $(M+1) \times 4$ switches $12t$ to turn on all the switches $12t$ for connecting all the computing bit lines ($xB_{ik}$) to the horizontal line YL, where $0<=i<=M$, and $0<=k<=3$. After all the computing bit line $xB_{ik}$ are connected to the horizontal line YL, the average voltage of the line YL is calculated as follows: $V_{YL}=(\Sigma_{i=0}^{M} W_i * Q_i)/(C_{xB}*(M+1)*4)$, where $(M+1) \times 4$ is the total number of the computing bit lines ($xB_{ik}$) and $C_{xB}$ denotes the capacitance of each computing bit line. According to a reference voltage $V_{ref}$ at a reference computing bit line $Y_{ref}$, the ADC 120 converts the average voltage $V_{YL}$ into a digital value $Y_{mea}$. According to two predefined weights C1 and C2, the accumulation circuit 160 receives the digital value $Y_{mea}$ for a currently selected/activated computing word line, calculates an accumulate value and outputs one of the digital value $Y_{mea}$ and the accumulate value as an output digital value $Y_{out}$ (will be described later). Please note that the accumulation circuit 160 is optional, and thus it is represented by dashed lines in FIG. 1A.

Figure 2A:
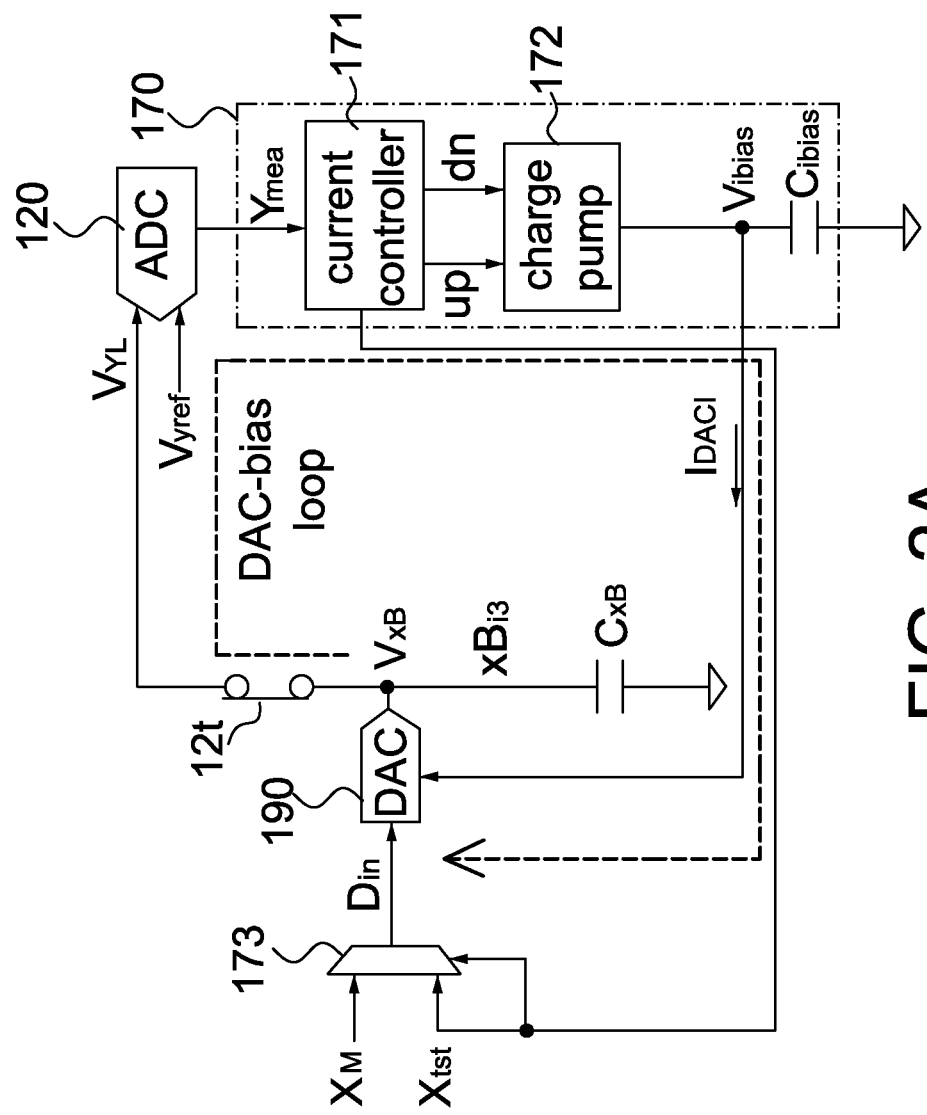
FIG. 2A is a diagram showing the digital DAC-bias loop according to an embodiment of the invention.

Without using an analog bandgap circuit, the invention uses a digital DAC-bias loop to provide a constant current source $I_{DACI}$ and a bias voltage $V_{ibias}$ of the constant current source $I_{DACI}$ for all the DACs 190. Based on the digital DAC-bias loop, the constant current source $I_{DACI}$ and its bias voltage $V_{ibias}$ are insensitive to PVT variation. FIG. 2A is a diagram showing the digital DAC-bias loop according to an embodiment of the invention. Referring to FIG. 2A, the digital DAC-bias loop includes a multiplexer 173, a DAC 190, a switch $12t$, a computing bit line $xB_{ik}$ with a capacitor $C_{xB}$, an ADC 120 and a voltage/current adjusting circuit 170. The voltage/current adjusting circuit 170 includes a current controller 171, a charge pump 172 and a capacitor $C_{ibias}$.

The digital DAC-bias loop is a digital-controlled closed loop that adjusts a constant current source $I_{DACI}$ from the charge pump 172 and a bias voltage $V_{ibias}$ of the capacitor $C_{ibias}$ so that the input digital value $D_{in}$ of the DAC 190 and the output digital value $Y_{mea}$ from the ADC 120 are close to each other. For example, in a calibration mode, the value $X_{tst}$ is set to its maximum value (e.g., 15) by the current controller 171 and selected as the output $D_{in}$ to the DAC 190 via the MUX 173; the DAC 190 then charges the capacitor $C_{xB}$ with a current $I_{DACO}$ (see FIG. 3A) so that an analog voltage $V_{YL}$ is produced at the horizontal line YL. Afterward, the ADC 120 outputs the digital value $Y_{mea}$ to the current controller 171 according to the analog voltage $V_{YL}$. If the value $Y_{mea}$ is greater than the value $X_{tst}$, the current controller 171 increases the pulse width of the signal DN to decrease the amplitude of $I_{DACI}$; otherwise, the current controller 171 increases the pulse width of the signal UP to increase the amplitude of $I_{DACI}$. Meanwhile, the current controller 171 also adjusts the digital value $X_{tst}$. In this manner, the steps are repeated until the value $Y_{mea}$ is equal to the value $X_{tst}$. In a normal mode, the input synapse value $X_M$ is selected as the output $D_{in}$ to the DAC 190 via the MUX 173. In an embodiment, the capacitor $C_{ibias}$ is implemented by a metal-oxide-metal (MOM) capacitor.

Figure 2B:
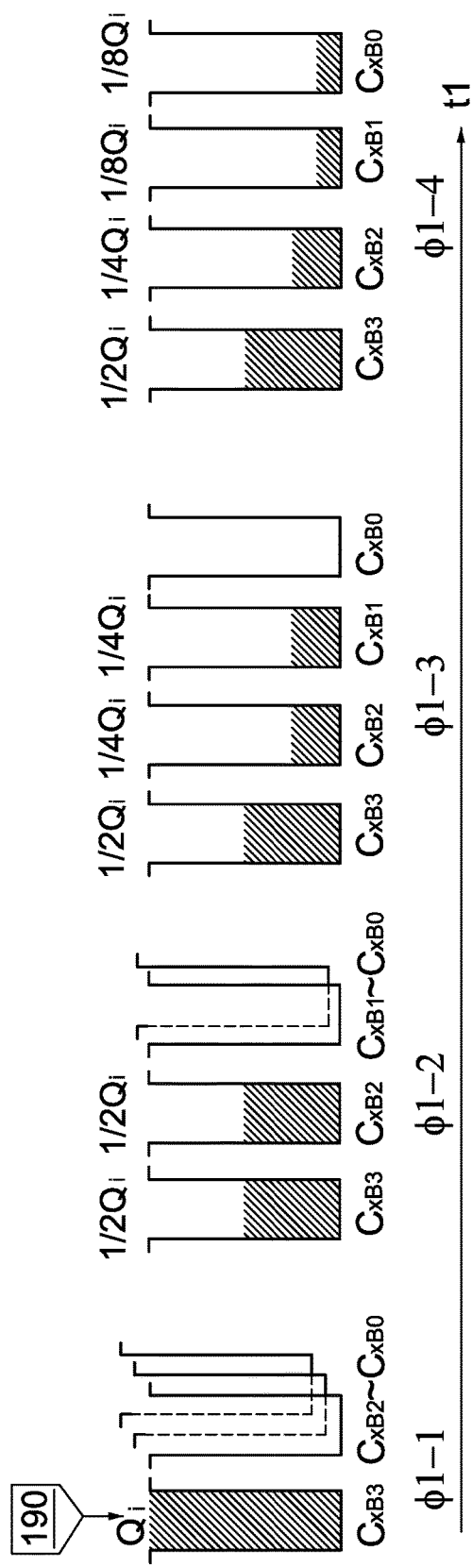
FIGS. 2B and 2C show two examples of charge sharing mechanism with a binary-weighted ratio based on multiple amounts of charge $Q_i$, $1/2Q_i$, $1/4Q_i$, and $1/8Q_i$.
Figure 2C:
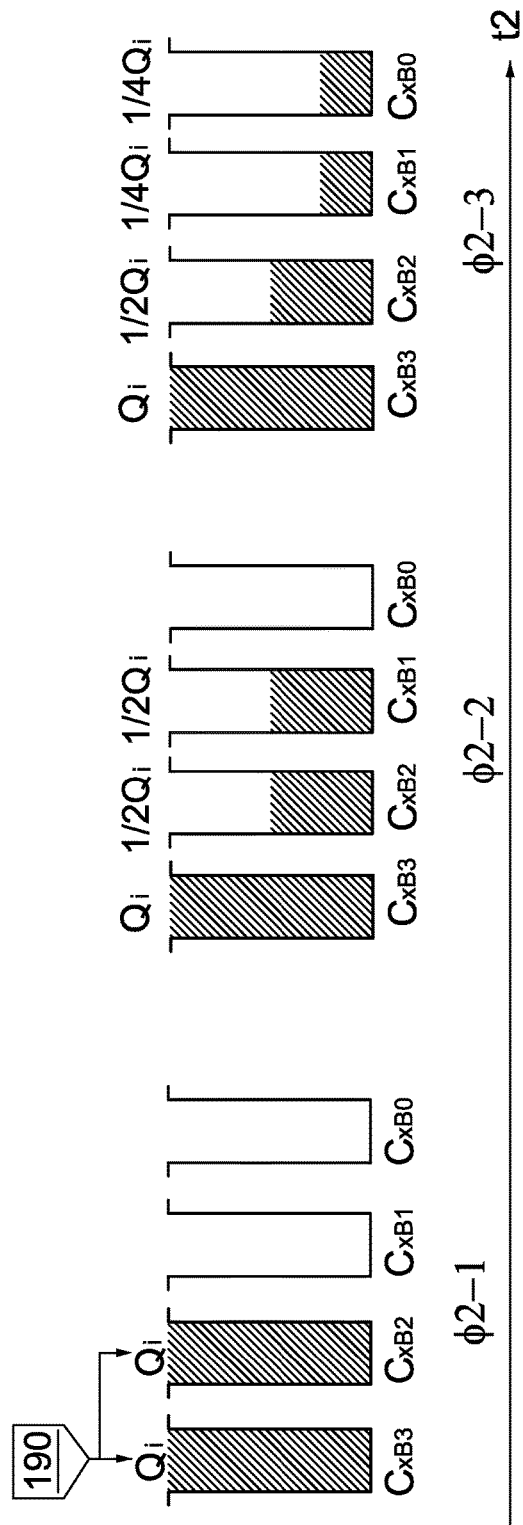

As indicated above, each lane includes a DAC 190 and four computing bit lines ($xB_{i0} \sim xB_{i3}$) as shown in FIGS. 1A and 1B. At first, the DAC 190 charges the capacitor $C_{xB}$ of the first computing bit lines $xB_{i3}$ with the amount of charge $Q_i$ proportional to $X_i$ in each lane. Then, the invention uses a charge sharing mechanism to distribute the charge $Q_i$ to other computing bit lines ($xB_{i0} \sim xB_{i2}$) with a binary-weighted ratio, a uniform-weighted ratio or a hybrid ratio. FIGS. 2B and 2C show two examples of charge sharing mechanism with a binary-weighted ratio based on multiple amounts of charge $Q_i$, $1/2Q_i$, $1/4Q_i$ and $1/8Q_i$. For the example of FIG. 2B, after the synapse values $X_i$ are inputted, the charge sharing process is conducted and divided into four phases as follows. Phase $\phi1$-1: the DAC 190 charges the capacitor $C_{xB}$ of the first computing bit lines $xB_{i3}$ with the amount of charge $Q_i$ proportional to $X_i$ in each lane and the capacitors $C_{xB}$ of the other computing bit lines ($xB_{i2} \sim xB_{i0}$) are empty. Here, when the capacitor $C_{xB}$ of the first computing bit lines $xB_{i3}$ is full, its maximum amount of charge is equal to $Q_{Max}$, where $Q_i <= Q_{Max}$. Phase $\phi1$-2: the charge stored in the capacitor $C_{xB}$ of the first computing bit lines $xB_{i3}$ is distributed to the second computing bit lines $xB_{i2}$ so that the amounts of charge stored in the capacitor $C_{xB}$ of the first computing bit lines $xB_{i3}$ and in the capacitor $C_{xB}$ of the second computing bit lines $xB_{i2}$ are $1/2*Q_i$. Phase $\phi1$-3: the charge stored in the capacitor $C_{xB}$ of the second computing bit lines $xB_{i2}$ is distributed to the second computing bit lines $xB_{i1}$ so that the amounts of charge stored in the capacitor $C_{xB}$ of the second computing bit lines $xB_{i2}$ and in the capacitor $C_{xB}$ of the third computing bit lines $xB_{i1}$ are $1/4*Q_i$. Phase $\phi1$-4: the charge stored in the capacitor $C_{xB}$ of the third computing bit lines $xB_{i1}$ is distributed to the fourth computing bit lines $xB_{i0}$ so that the amounts of charge stored in the capacitor $C_{xB}$ of the third computing bit lines $xB_{i1}$ and in the capacitor $C_{xB}$ of the fourth computing bit lines $xB_{i0}$ are $1/4*Q_i$. Thus, the multiplication operation of $W_{ij}*Q_i$ in lane i and row j is performed as follows: $W_{ij}*Q_i=(\Sigma_{k=0}^{3} W_{ij}[k]*Q_i[k])=W_{ij}[3]*1/2*Q_i+W_{ij}[2]*1/4*Q_i+W_{ij}[1]*1/8*Q_i+W_{ij}[0]*1/8*Q_i=Q_i*(1/2*W_{ij}[3]+1/4*W_{ij}[2]+1/8*W_{ij}[1]+1/8*W_{ij}[0])$.

For the example of FIG. 2C, after the synapse values Xi are inputted, the charge sharing process is conducted and divided into three phases as follows. Phase $\phi2$-1: the DAC 190 simultaneously charges the two capacitors $C_{xB}$ of the first computing bit lines $xB_{i3}$ and the second computing bit lines $xB_{i2}$ with the amount of charge $2*Q_i$ proportional to $X_i$ in each lane and the capacitors $C_{xB}$ of the other computing bit lines ($xB_{i1}$~$xB_{i0}$) are empty. Here, when the capacitors $C_{xB}$ of the first computing bit lines $xB_{i3}$ and the second computing bit lines $xB_{i2}$ are full, their maximum amounts of charge are equal to $2*Q_{Max}$, where $2*Q_i<=2*Q_{Max}$. Phase φ2-2: the charge stored in the capacitor $C_{xB}$ of the second computing bit lines $xB_{i2}$ is distributed to the third computing bit lines $xB_{i1}$ so that the amounts of charge stored in the capacitor $C_{xB}$ of the second computing bit lines $xB_{i2}$ and in the capacitor $C_{xB}$ of the third computing bit lines $xB_{i1}$ are $1/2*Q_i$. Phase φ2-3: the charge stored in the capacitor $C_{xB}$ of the third computing bit lines $xB_{i1}$ is distributed to the fourth computing bit lines $xB_{i0}$ so that the amounts of charge stored in the capacitor $C_{xB}$ of the third computing bit lines $xB_{i1}$ and in the capacitor $C_{xB}$ of the fourth computing bit lines $xB_{i0}$ are $1/4*Q_i$. Thus, the multiplication of $W_{ij}*Q_i$ in lane i and row j is performed as follows: $W_{ij}*Q_i=(\Sigma_{k=0}^{3} W_{ij}[k]*Q_i[k])=W_{ij}[3]*Q_i+W_{ij}[2]*1/2*Q_i+W_{ij}[1]*1/4*Q_i+W_{ij}[0]*1/4*Q_i=Q_i*(W_{ij}[3]+1/2*W_{ij}[2]+1/4*W_{ij}[1]+1/4*W_{ij}[0])$.

The invention utilizes the charge sharing mechanism to achieve a charging weighting ratio of 1/2:1/4:1/8:1/8 in FIG. 2B and a charging weighting ratio of 1:1/2:1/4:1/4 in FIG. 2C for the four computing bit lines in each lane; the ratios are equivalent to a binary-weighted ratio of 4:2:1:1 after normalization. In an alternative embodiment, similar to FIGS. 2B and 2C, the invention utilizes the charge sharing mechanism to achieve a charging weighting ratio of 1/4:1/4:1/4:1/4 for the four computing bit lines in each lane; the ratio is equivalent to a uniform-weighted ratio of 1:1:1:1 after normalization. Likewise, the invention may utilize the charge sharing mechanism to achieve a charging weighting ratio of 3/8:3/8:1/8:1/8 for the four computing bit lines in each lane; the ratio is equivalent to a hybrid ratio of 3:3:1:1 after normalization.

As to the uniform-weighted ratio of 1:1:1:1, the four computing bit lines $xB_{ik}$ together with four SRAM cells 110 in each row of each lane are used to represent its corresponding weight value $W_i$ ranging from 0 to 4 (equivalent to 2-bit binary numbers Wi). In this example, the bit length of the weight values $W_i$ is two. As shown in Table 1, the $W_{ij}[k]$ value in each of the four SRAM cells 110 in each row for each lane has the same weight of 1 assigned to it, where $0<=k<=3$.

TABLE 1

| $W_{ij}[3] \times 1$ | $W_{ij}[2] \times 1$ | $W_{ij}[1] \times 1$ | $W_{ij}[0] \times 1$ | $W_i$ value |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 2 |
| 0 | 1 | 1 | 0 | 2 |
| --- | --- | --- | --- | --- |
| 1 | 1 | 1 | 0 | 3 |
| 1 | 1 | 1 | 1 | 4 |

If the bit length of the weight values Wi equal to two is long enough, the binary-weighted ratio of 1:1:1:1 would be applied to the four computing bit lines $xB_{ik}$ for each lane so that there are only two voltage states (representing two digits 0 and 1) for each computing bit line. Thus, it saves power consumption of the DAC 190. In a scenario that $V_{xB}=0.5V$, the DAC 190 operates in a low power mode and each computing bit line has two voltage states (0V and 0.5V) to represent two different digits (0 and 1).

As to the binary-weighted ratio of 4:2:1:1, the four computing bit lines $xB_{ik}$ together with four SRAM cells 110 in each row of each lane are used to represent the weight value Wi ranging from 0 to 8 (equivalent to 3-bit binary numbers Wi). In this example, the bit length of the weight values $W_i$ is three. As shown in Table 2, the $W_{ij}[k]$ value in each of the four SRAM cells 110 in each row for each lane has a corresponding weight (4, 2, 1 or 1) assigned to it, where $0<=k<=3$.

TABLE 2

| $W_{ij}[3] \times 4$ | $W_{ij}[2] \times 2$ | $W_{ij}[1] \times 1$ | $W_{ij}[0] \times 1$ | $W_i$ value |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 2 |
| 0 | 1 | 0 | 0 | 2 |
| 0 | 1 | 0 | 1 | 3 |
| --- | --- | --- | --- | --- |
| 1 | 1 | 1 | 0 | 7 |
| 1 | 1 | 1 | 1 | 8 |

In a case that the binary-weighted ratio of 4:2:1:1 is applied to the four computing bit lines $xB_{ik}$ for each lane, because there are up to four voltage states (representing four digital values 0, 1, 2 and 4) for each computing bit line, the output voltage $V_{XB}$ of the DAC 190 in FIG. 3 has to be further raised compared to the case of two voltage states (representing two digital values 0 and 1) for each computing bit line, otherwise, it would be difficult to discriminate among the four voltage states of each computing bit line. In a scenario that $V_{XB}=1.1V$, the DAC 190 operates in a high power mode and each computing bit line has four voltage states (0V, 0.5V, 0.8V and 1.1V) to represent four different digital values (0, 1, 2, 4). In this scenario, power consumption is greater than that in the case of the binary-weighted ratio equal to 1:1:1:1.

Figure 3A:
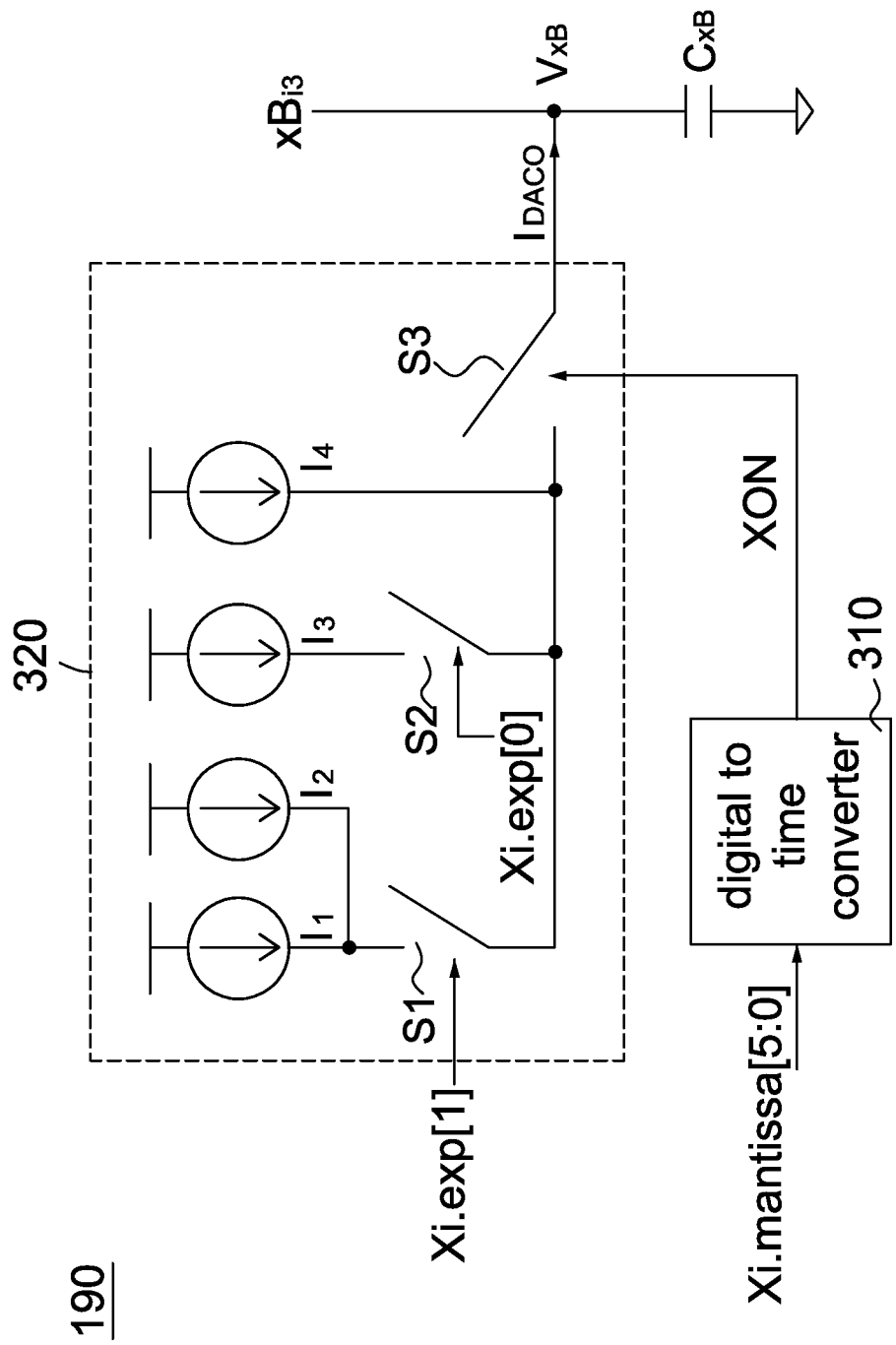
FIG. 3A is a schematic diagram showing a DAC according to an embodiment of the invention.

FIG. 3A is a schematic diagram showing a DAC according to an embodiment of the invention. Referring to FIG. 3A, the DAC 190 includes a digital to time converter (DTC) 310 and a time to analog converter (TAC) 320. The DAC 190 converts a synapse value $X_i$ in a floating point form, e.g., $X_i=\text{mantissa}[5:0]*2^{(0+exponent[1:0])}$, into an analog voltage $V_{xB}$. Each synapse value $X_i$ is represented in a floating point form for a greater value range and keeping the relative error constant. Its mantissa part (mantissa[5:0]) is used to control the pulse width (PW) (or pulse on period) of a time-based pulse signal XON. Specifically, the DTC 310 converts the mantissa part (mantissa[5:0]) of the synapse value $X_i$ into a time-based pulse signal XON with its pulse width proportional to its mantissa part (mantissa[5:0]). According to the exponent part (exponent[1:0]) of Xi, the TAC 320 converts the time-based signal XON into the output voltage $V_{xB}$. Specifically, the signal XON is used to control the switch S3 so that at least one of the four current sources ($I_1$~$I_4$) can charge the capacitor $C_{xB}$ of the computing bit line $xB_{i3}$ to the voltage $V_{xB}$ in the TAC 320. The exponent part (exponent[1:0]) of $X_i$ are respectively used to control the switches S1 and S2, i.e., controlling the amount of charging current. Referring to FIGS. 2A and 3A, $I_{DACI}=I_1+I_2+I_3+I_4$ and $I_1=I_2=I_3=I_4$. For a steady flow of charge through a surface, the amount of charge $Q_{xB}$ transferred through the surface over a time period T is defined by: $Q_{xB}=I_{DACO}*T=I_{DACO}*X_i.\text{mantissa}[5:0]*2^{(0+xi.exponent[1:0])}*\text{UnitTime1}$, where $I_{DACO}$ denotes the current passing through the switch S3 and UnitTime1 denotes the internal clock cycle in DTC 310. The less the UnitTime1, the more precise the amount of charge $Q_{xB}$ is and the more difficult it is to implement the circuit.

Figure 3B:
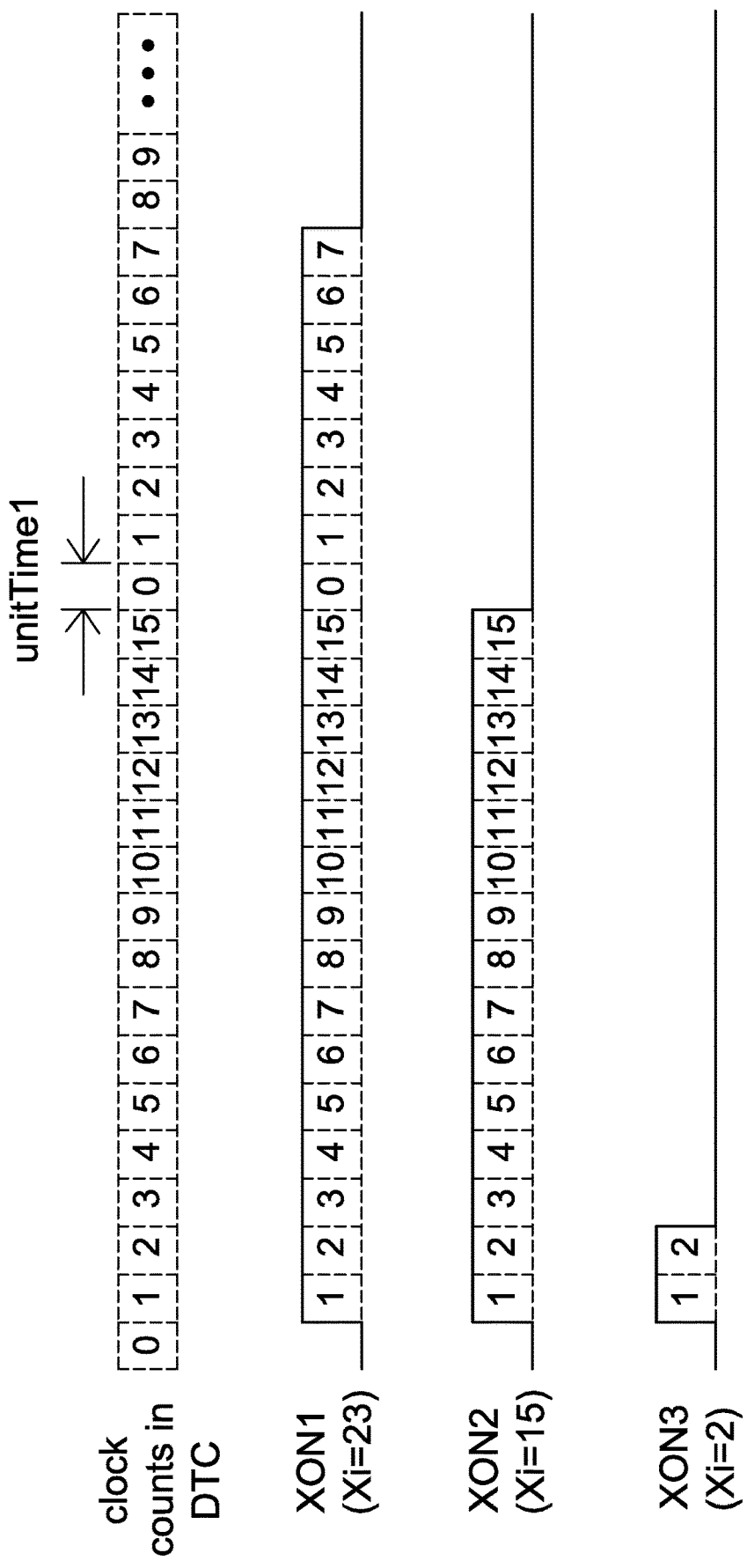
FIG. 3B is an exemplary time diagram showing the clock counts in DTC 310 and three time-based signals XON1~XON3.

FIG. 3B is an exemplary time diagram showing clock counts in DTC 310 and three time-based pulse signals XON1~XON3. Referring to FIG. 3B, three time-based pulse signals XON1~XON3 corresponding to three synapse values $X_i$ are provided by way of example. In a case that $X_i=23$, it can be expressed in a floating point form in the following way: $X_i=23*2^{(0+0)}$; after its mantissa part (mantissa[5:0]=23) is inputted to the DTC 310, the DTC 310 produces the time-based pulse signal XON1 with its pulse width equal to 23 clock cycles. In a case that $X_i=15$, it can be expressed in a floating point form in the following way: $X_i=15*2^{(0+0)}$; after its mantissa part (mantissa[5:0]=15) is inputted to the DTC 310, the DTC 310 produces the time-based pulse signal XON2 with its pulse width equal to fifteen clock cycles. In a case that $X_i=2$, it can be expressed in a floating point form in the following way: $X_i=2*2^{(0+0)}$; after its mantissa part (mantissa[5:0]=2) is inputted to the DTC 310, the DTC 310 produces the time-based pulse signal XON3 with its pulse width equal to two clock cycles.

Figure 4A:
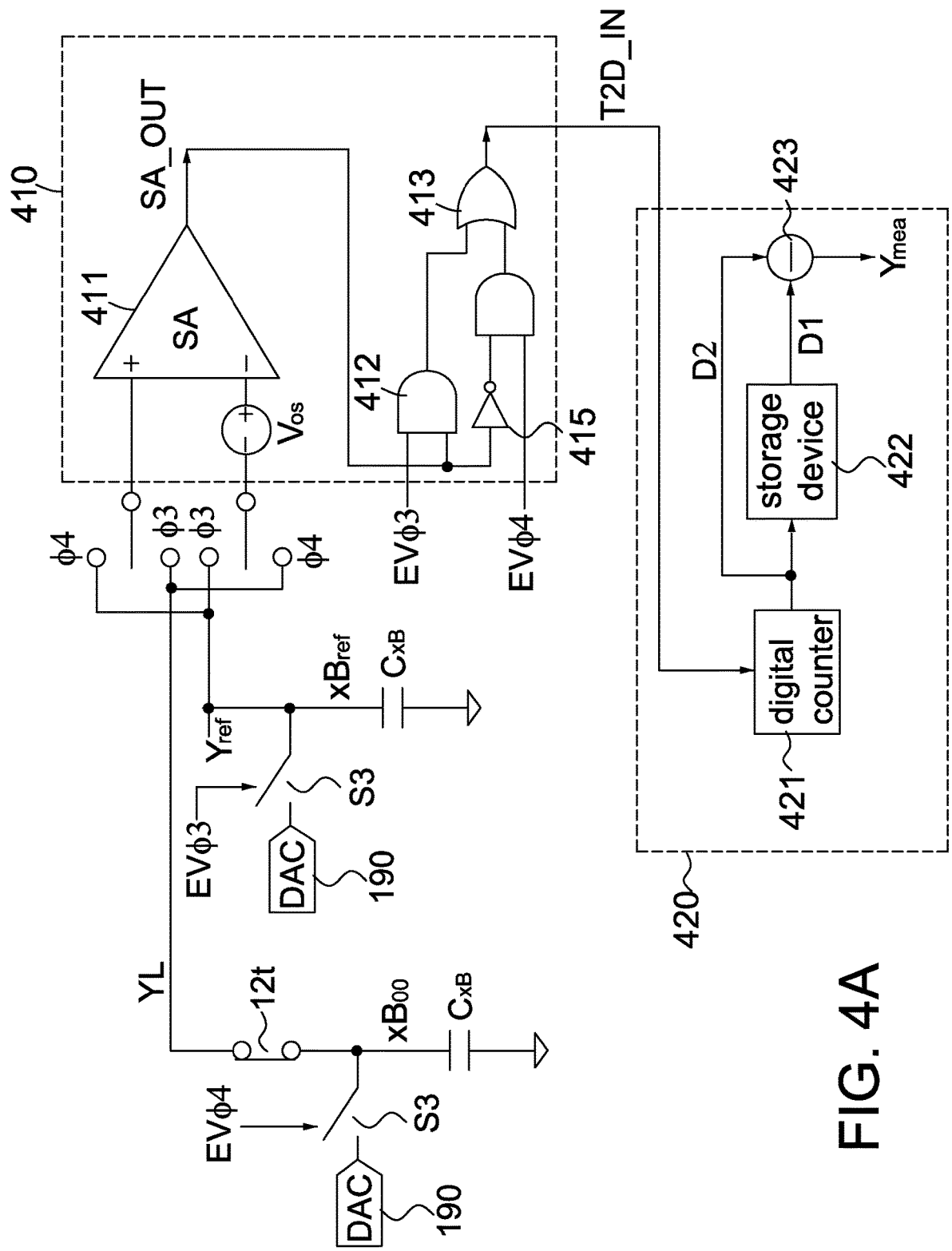
FIG. 4A is a schematic diagram showing an ADC according to an embodiment of the invention.

FIG. 4A is a schematic diagram showing an ADC according to an embodiment of the invention. Referring to FIG. 4A, the ADC 120 includes an analog to time converter (ATC) 410 and a time to digital converter (TDC) 420. The ATC 410 includes a sense amplifier 411, two AND gates 412, an OR gate 413 and an inverter 415. The TDC 420 includes a digital counter 421, a storage device 422 and a subtractor 423. The sense amplifier 411 compares the average voltage $V_{YL}$ at the horizontal line YL with the voltage ramp $V_{Yref}$ at a reference computing bit line $Y_{ref}$ to produce an output signal SA_OUT. The voltage ramp $V_{Yref}$ is obtained by charging the reference computing bit line $Y_{ref}$ with the output current from the DAC 190. To cancel the input offset voltage $V_{os}$ of the sense amplifier 411, an evaluation-enable signal EVϕ3 related to a sensing period ϕ3 and an evaluation-enable signal EVϕ4 related to a sensing period ϕ4 are applied for measuring the digital value $Y_{mea}$.

Figure 4B:
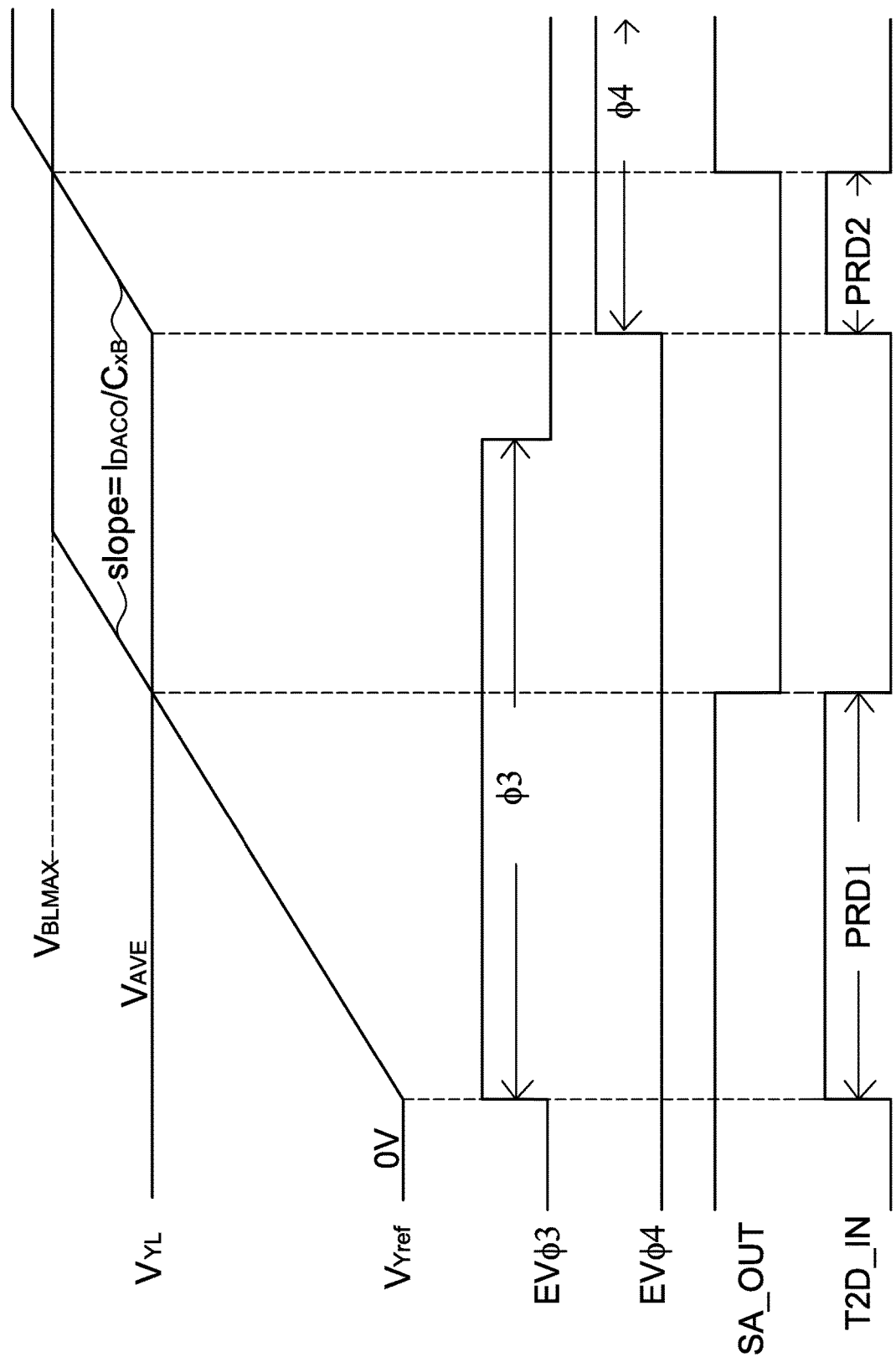
FIG. 4B is a timing diagram showing six voltage signals $V_{YL}$, $V_{Yref}$, EVφ3, EVφ4, SA_OUT and T2D_IN.

FIG. 4B is a timing diagram showing six voltage signals $V_{YL}$, $V_{Yref}$, EVϕ3, EVϕ4, SA_OUT and T2D_IN. Referring to FIGS. 4A and 4B, after the synapse values Xi are inputted to the IMC SRAM device 100, a computing word line is activated and the average voltage $V_{YL}$ at the line YL is obtained, an evaluation-enable signal EVϕ3 is applied to the switch S3 in the DAC 190 connected to the reference computing bit line $Y_{ref}$ and an evaluation-enable signal EVϕ4 is applied to the switch S3 in the DAC 190 connected to one computing bit line, such as $xB_{00}$. Please be noted that the reference computing bit line $Y_{ref}$ is selected from the computing bit lines $xB_{ik}$ (not $xB_{00}$) and the reference computing bit line $Y_{ref}$ has to be discharged to the ground voltage before the evaluation-enable signal EVϕ3 is applied to the switch S3 in the DAC 190 connected to the reference computing bit line $Y_{ref}$.

During the sensing period ϕ3, the switch S3 connected to the reference computing bit line $Y_{ref}$ is turned on, the switch S3 connected to the computing bit line $xB_{00}$ and the switch 12t are turned off and the non-inverting input terminal and the inverting input terminal of the sense amplifier 411 are respectively connected to the lines YL and $Y_{ref}$. Accordingly, the capacitor $C_{xB}$ of the reference computing bit line $Y_{ref}$ is charged by the DAC 190, so the voltage $V_{Yref}$ increases as time elapses. When the voltage $V_{YL}$ is greater than the voltage $V_{Yref}$, the output signal SA_OUT of the sense amplifier 411 is at the "high" voltage state. As soon as the voltage $V_{Yref}$ is greater than the voltage $V_{YL}$, the output signal SA_OUT of the sense amplifier 411 flips to the ground voltage state. After the voltage $V_{Yref}$ reaches its maximum voltage $V_{BLMAX}$, the sensing period ϕ3 of the evaluation-enable signal EVϕ3 is terminated and then the sensing period ϕ4 starts. During the sensing period ϕ4, the switches S3 connected to the computing bit line $xB_{00}$ and the switch 12t are turned on, the switch S3 connected to the reference computing bit line $Y_{ref}$ is turned off and the inverting input terminal and the non-inverting input terminal of the sense amplifier 411 are respectively connected to the lines YL and $Y_{ref}$. Accordingly, the capacitor $C_{xB}$ of the reference computing it line YL is charged by the DAC 190, so the voltage $V_{YL}$ increases as time elapses. As soon as the voltage $V_{YL}$ is greater than the voltage $V_{Yref}$, the output signal SA_OUT of the sense amplifier 411 flips back to the high voltage state.

Mathematically, the amount of charge Q on each plate of a capacitor is defined by Q=C*V, where C denotes the capacitance of the capacitor and V denotes the voltage between the plates. As mentioned above, the amount of charge Q transferred through the surface over a time period T is defined by: Q=I*T. Accordingly, Q=I*T=>T=C*V/I. During the sensing period ϕ3, PRD1 is the time period that it takes for the voltage $V_{Yref}$ to increase from 0V to $V_{YL}(=V_{AVE})$. Thus, $PRD1=C_{xB}*(V_{YL}-V_{os})/I_{DACO}$, where $V_{os}$ denotes the input offset voltage of the sense amplifier 411. During the sensing period ϕ4, PRD2 is the time period that it takes for the voltage $V_{YL}$ to increase from $V_{YL}(=V_{AVE})$ to $V_{BLMAX}$. Thus, $PRD2=C_{xB}*(V_{BLmax}-(V_{YL}+V_{os}))/I_{DACO}$. According to the input signal T2D_IN, the digital counter 421 firstly measures the first pulse on period PRD1 to supply a digital output D1 to the storage device 422, and then measures the second pulse on period PRD2 to produce a digital output D2. Afterward, the subtractor 423 subtracts D2 from D1 to produce $Y_{mea}$. Thus, $Y_{mea}=D1-D2$; $PRD1-PRD2=Y_{mea}*UnitTime2=C_{xB}*(2*V_{YL}-V_{BLmax})/I_{DACO}$, where UnitTime2 denotes the input clock cycle for the digital counter 421. After D2 is subtracted from D1, the result ($Y_{mea}$) of computing the propagation function ($\Sigma_{i=0}^{M}W_i*X_i$) is obtained and the input offset voltage $V_{os}$ is cancelled.

Figure 5:
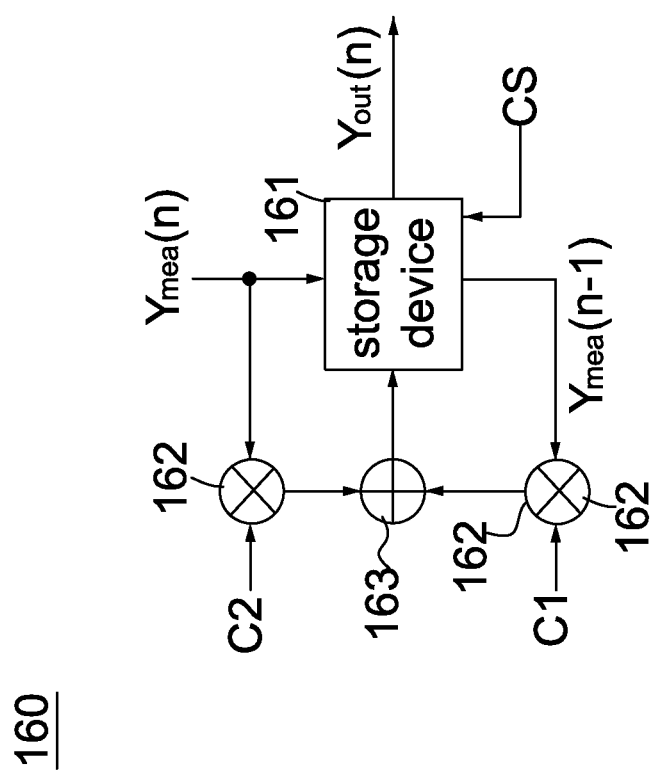
FIG. 5 is a schematic diagram showing an accumulation circuit according to an embodiment of the invention.

FIG. 5 is a schematic diagram showing an accumulation circuit according to an embodiment of the invention. Referring to FIG. 5, the accumulation circuit 160 includes a storage device 161, two multipliers 162 and an adder 163. According to two predefined weights (C1 and C2), the accumulation circuit 160 receives the digital value $Y_{mea}$ for a currently selected/activated computing word line, calculates an accumulate value ($=C1*Y_{mea}(n-1)+C2*Y_{mea}(n)$) and outputs one of the digital value $Y_{mea}$ and the accumulate value as an output digital value $Y_{out}(n)$. Specifically, the storage device 161 receives a first input digital value $Y_{mea}(n)$ from the ADC 120 and a second input digital value ($C1*Y_{mea}(n-1)+C2*Y_{mea}(n)$) from the adder 163, supplies its previous digital value $Y_{mea}(n-1)$ to the lower multiplier 162 and outputs one of the first and the second input digital values as the output digital value $Y_{out}(n)$ according to a control signal CS. In one embodiment, C2 is varied according to the currently activated computing word line and C1 is varied according to its previously activated computing word line. Please note that each of the storage devices 161 and 422 includes, without limitation, a D-flip-flop, a latch and a memory device.

Figures 6A, 6B:
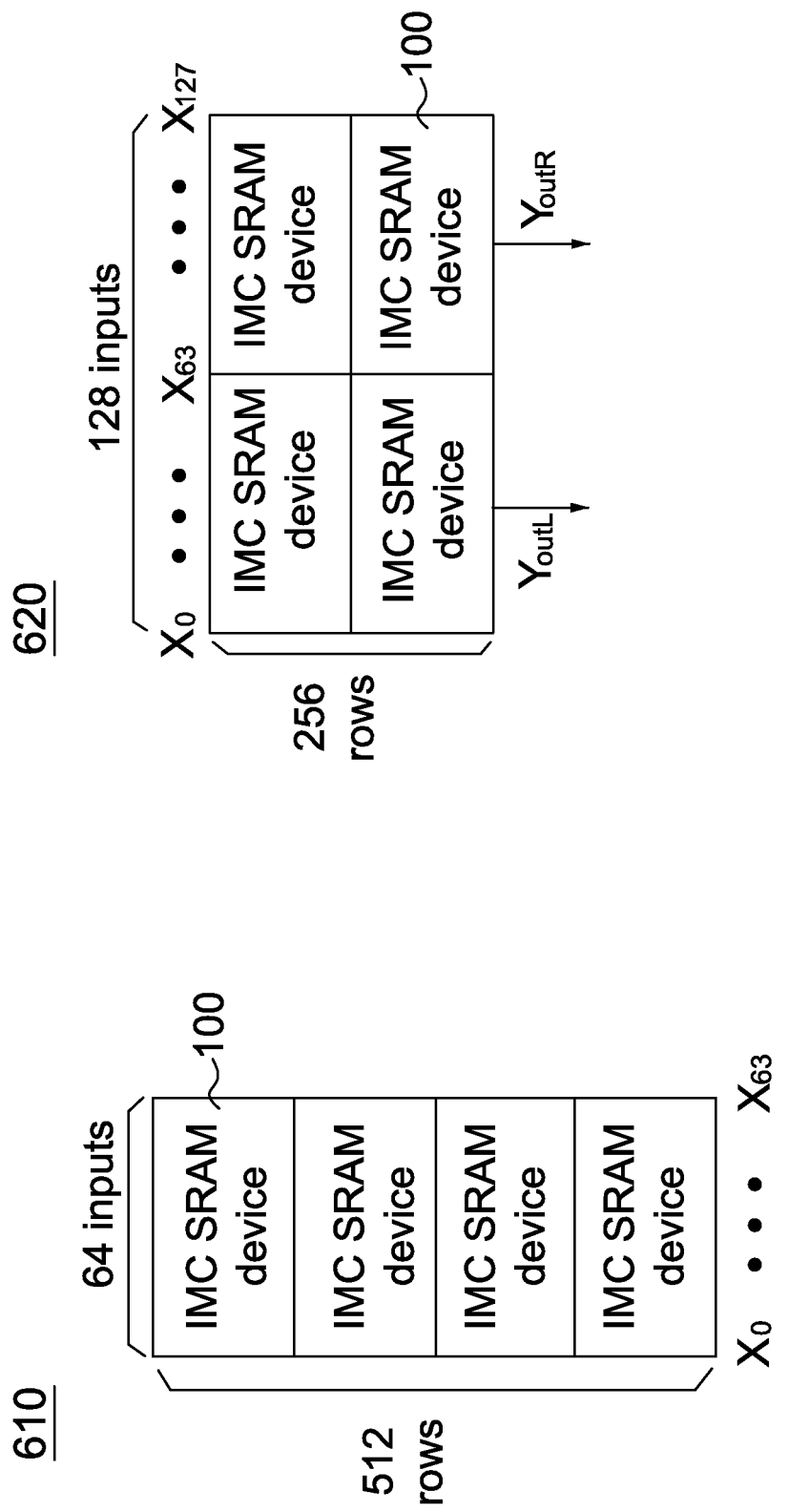
FIGS. 6A-6C are three exemplary configurations showing four IMC SRAM devices of 64-input×128-row are organized to from a logical IMC memory block with different numbers of inputs (64 inputs, 128 inputs, 256 inputs) according to an embodiment of the invention.
Figure 6C:
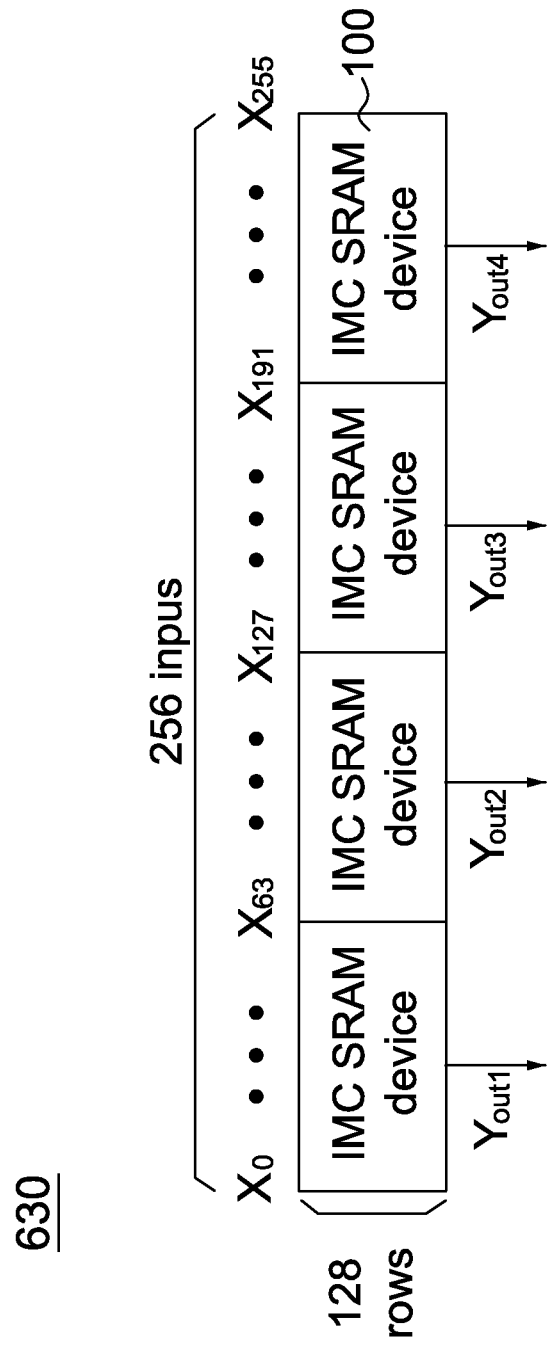

FIGS. 6A-6C are three exemplary configurations showing four same IMC SRAM devices of 64-input×128-row are organized to form a logical IMC memory block with different numbers of inputs (64 inputs, 128 inputs, 256 inputs) according to an embodiment of the invention. In the embodiment of FIG. 6A, four same IMC SRAM devices 100 are arranged in a column and the sixty-four input terminals for synapse values $X_0 \sim X_{63}$ of the four IMC SRAM devices 100 of 64-input×128-row (i.e., M=63, N=127) are respectively connected together to form a logical IMC memory block 610 of 64 synapse value inputs and 512 rows. In this specification, "the sixty-four input terminals for synapse values $X_0 \sim X_{63}$ of the four IMC SRAM devices 100 are respectively connected together" indicates that four input terminals $X_0$ are connected together, four input terminals $X_1$ are connected together, . . . , and four input terminals $X_{63}$ are connected together, but the four input terminals $X_0$ are isolated from the other input terminals $X_1 \sim X_{63}$, the four input terminals $X_1$ are isolated from the other input terminals $X_0, X_2 \sim X_{63}$, . . . , and the four input terminals $X_{63}$ are isolated from the other input terminals $X_0 \sim X_{62}$. Accordingly, when a set of synapse values $X_0 \sim X_{63}$ are inputted to the sixty-four input terminals of the logical IMC memory block 610, the four IMC SRAM devices 100 operate in parallel to produce four output digital values $Y_{out}$. Thus, the embodiment achieves a goal of parallel processing.

In the embodiment of FIG. 6B, the four same IMC SRAM devices 100 are organized to form a logical IMC memory block 620 of 128-input×256-row (i.e., M=127, N=255). In FIG. 6B, two of the four IMC SRAM devices 100 are arranged in a left column while the other two IMC SRAM devices 100 are arranged in a right column. The sixty-four input terminals for synapse values $X_0 \sim X_{63}$ of the two IMC SRAM devices 100 in the left column (left group) are respectively connected together while the sixty-four input terminals for synapse values $X_{64} \sim X_{127}$ of the two IMC SRAM devices 100 in the right column (right group) are respectively connected together. Accordingly, after a set of synapse values $X_0 \sim X_{127}$ are inputted to the logical IMC memory block 620, the four IMC SRAM devices 100 operate in parallel to produce four output digital values. Specifically, when a first half ($X_0 \sim X_{63}$) of the set of synapse values $X_0 \sim X_{127}$ are inputted to the input terminals of the left column, the two IMC SRAM devices 100 in the left column operate in parallel to produce two left output digital values $Y_{outL}(=\Sigma_{i=0}^{63} W_i^* X_i)$; when a second half ($X_{64} \sim X_{127}$) of the set of synapse values $X_0 \sim X_{127}$ are inputted to the input terminals of the right column, the two IMC SRAM devices 100 in the right column operate in parallel to produce two right output digital values $Y_{outR}(=\Sigma_{i=64}^{127} W_i^* X_i)$. The four output digital values may be temporarily stored in another SRAM for further computations. Alternatively, one of the two left output digital values $Y_{outL}$ and one of the two right output digital values $Y_{outR}$ are summed up to generate the final result: $Y_{outS} = \Sigma_{i=0}^{127} W_i^* X_i (=\Sigma_{i=0}^{63} W_i^* X_i + \Sigma_{i=64}^{127} W_i^* X_i)$. Thus, the embodiment achieves a goal of parallel processing and extending the total number of the neuron's synapses from 64 to 128.

In the embodiment of FIG. 6C, the four same IMC SRAM devices 100 are organized in a row to form a logical IMC memory block 630 of 256-input×128-row. In FIG. 6C, after a set of synapse values $X_0 \sim X_{255}$ are inputted to the logical IMC memory block 630, the four IMC SRAM devices 100 operate in parallel to produce four output digital values. Specifically, a first quarter ($X_0 \sim X_{63}$) of a set of synapse values $X_0 \sim X_{255}$ are inputted to the sixty-four input terminals of the left-most IMC SRAM device 100 to produce a first output digital value $Y_{out1}(=\Sigma_{i=0}^{63} W_i^* X_i)$; a second quarter ($X_{64} \sim X_{127}$) of the set of synapse values $X_0 \sim X_{255}$ are inputted to the sixty-four input terminals of the middle-left IMC SRAM device 100 to produce a second output digital value $Y_{out2}(=\Sigma_{i=64}^{127} W_i^* X_i)$; a third quarter ($X_{128} \sim X_{191}$) of the set of synapse values $X_0 \sim X_{255}$ are inputted to the sixty-four input terminals of the middle-right IMC SRAM device 100 to produce a third output digital value $Y_{out3}(=\Sigma_{i=128}^{191} W_i^* X_i)$; a fourth quarter ($X_{191} \sim X_{255}$) of the set of synapse values $X_0 \sim X_{255}$ are inputted to the sixty-four input terminals of the rightmost IMC SRAM device 100 to produce a fourth different output digital value $Y_{out4}(=\Sigma_{i=192}^{255} W_i^* X_i)$. The four different output digital values ($Y_{out1}, Y_{out2}, Y_{out3}, Y_{out4}$) of the four IMC SRAM devices 100 in FIG. 6C may be temporarily stored in another SRAM for further computations, or be summed up to generate the final result $Y_{outS} = \Sigma_{i=0}^{255} W_i^* X_i$. Thus, the embodiment achieves a goal of parallel processing and extending the total number of the neuron's synapses from 64 to 255.

Figure 6D:
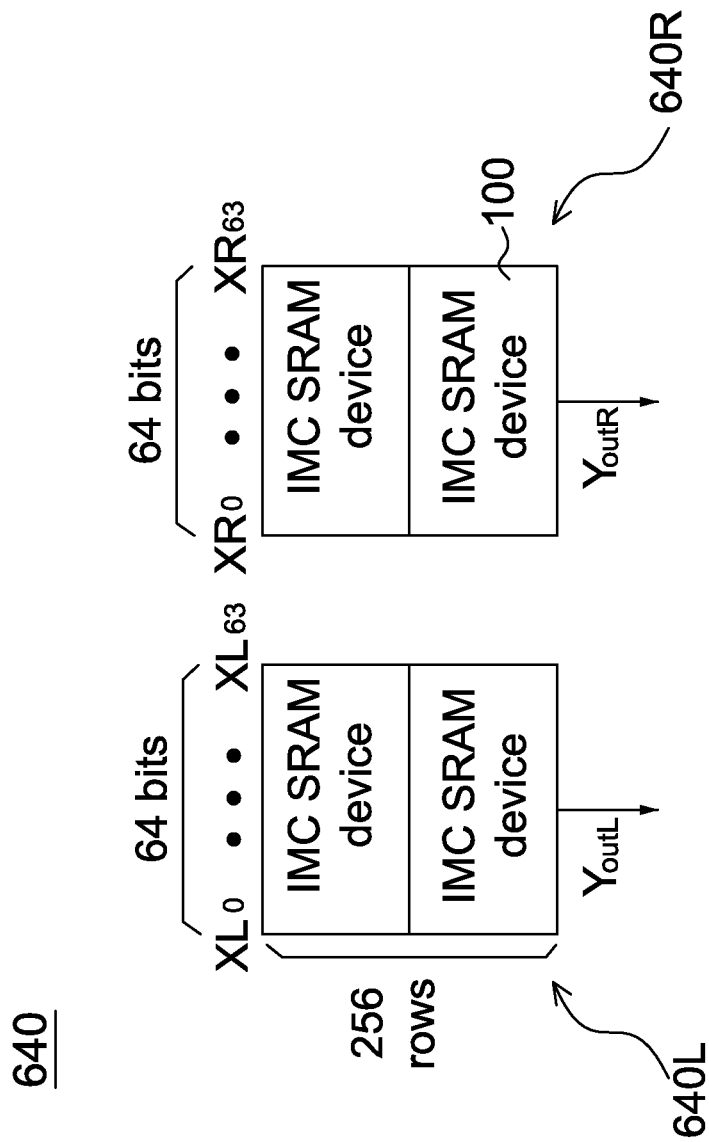
FIG. 6D is an exemplary configuration showing four IMC SRAM devices of 64-input×128-row are organized to form two independent logical IMC memory blocks of 64-input× 256-row according to another embodiment of the invention.

FIG. 6D is an exemplary configuration showing four same IMC SRAM devices of 64-input×128-row are organized to form a logic IMC memory block comprising two sub-blocks of 64-input×256-row according to an embodiment of the invention. Referring to FIG. 6D, the logic IMC memory block 640 includes two separate/isolated sub-blocks 640L and 640R. Two of the four IMC SRAM devices 100 are arranged in a left column to form a left sub-block 640L while the other two IMC SRAM devices 100 are arranged in a right column to form a right sub-block 640R. The sixty-four input terminals for synapse values $XL_0 \sim XL_{63}$ of the two IMC SRAM devices 100 in the left sub-block 640L are respectively connected together while the sixty-four input terminals for synapse values $XR_0 \sim XR_{63}$ of the two IMC SRAM devices 100 in the right sub-blocks 640L are respectively connected together. After a set of synapse values ($XL_0 \sim XL_{63}$) are inputted to the logical IMC sub-block 640L, its two IMC SRAM devices 100 operate in parallel to produce two output digital values $Y_{outL}(=\Sigma_{i=0}^{63} W_i^* XL_i)$. After a set of synapse values ($XR_0 \sim XR_{63}$) are inputted to the logical IMC sub-block 640R, its two IMC SRAM devices 100 operate in parallel to produce two output digital values $Y_{outR}(=\Sigma_{i=0}^{63} W_i^* XR_i)$. Since the two logical IMC sub-blocks 640L and 640R are separate/isolated, they are allowed to be configured to store two different bit lengths of $W_i$. For example, the two IMC SRAM devices 100 in the IMC sub-blocks 640L are configured to store 2-bit $W_i$ values and the two IMC SRAM devices 100 in the IMC sub-blocks 640R are configured to store 3-bit $W_i$ values. Thus, the embodiment achieves a goal of parallel processing and processing the $W_i$ values with different bit lengths.

Please note that the four IMC SRAM devices 100 forming the IMC memory blocks in FIGS. 6A~6D are provided by way of example and not limitations of the invention. In actual implementations, any other numbers of IMC SRAM devices 100 can be used to form an IMC memory block and this also falls in the scope of the invention. The logical IMC memory blocks (610~640) are suitable for use in artificial neurons, Referring back to FIG. 1A, in a partial average mode, the control signals $AE_{ik}$ are respectively applied to the switches 12t to turn on a portion of the switches 12t and turn off the other switches 12t; thus, only a portion of the computing bit lines ($xB_{ik}$) are correspondingly connected to the horizontal line YL, instead of all the computing bit lines being connected to the horizontal line YL. In an embodiment of the partial average mode, an IMC SRAM device 100 of 64-input×128-row (i.e., M=63, N=127) is logically divided into two IMC sub-arrays L and R of 32-input×128-row (i.e., M=31, N=127) (not shown). In this embodiment, the coefficients (weight values) for sub-array L are stored in $W_{ij}[k]$, where 0<=i<=31, and 0<=k<=3; meanwhile, the coefficients for sub-array R are stored in $W_{ij}[k]$, where 32<=i<=63, and 0<=k<=3. In order for the IMC operation in the sub-array L to be performed, a set of thirty-two synapse values $XL_0 \sim XL_{31}$ are inputted to the thirty-two input terminals of the sub-array L and only the switches 12t inside the sub-array L need to be turned on (with the other switches 12t being turned off) via their corresponding control signals $AE_{ik}$. In order for the IMC operation in the sub-array R to be performed, a set of thirty-two synapse values $XR_0 \sim XR_{31}$ are inputted to the thirty-two input terminals of the sub-array R, and only the switches 12t inside the sub-array R need to be turned on (with the other switches 12t being turned off) via their corresponding control signals $AE_{ik}$.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An in-memory computing memory device applied in an artificial neuron, comprising:
    an array of memory cells arranged in rows and columns and vertically divided into (M+1) lanes;
    a plurality of first word lines arranged corresponding to the respective memory cell rows, each connected to the memory cells in a corresponding row;
    a plurality of first bit lines arranged corresponding to the respective memory cell columns, each connected to the memory cells in a corresponding column;
    (M+1) input circuits having (M+1) data input terminals and coupled to the first bit lines, wherein each lane comprises P memory cell columns and a corresponding input circuit, P memory cells in each row for each lane storing a weight value $W_i$, wherein the input circuit in each lane charges a predefined first bit line with a default amount of charge proportional to an input synapse value $X_i$ at its data input terminal and then distributes the default amount of charge to the other second bit lines with a predefined ratio based on a constant current;
    a first wordline driver to activate one of the first word lines to retain a final amount of charge in each first bit line that is equivalent to a first product of its distributed amount of charge and a bit value stored in its corresponding memory cell; and
    an evaluation circuitry to selectively couple a selected number of the first bit lines to an accumulate line and convert an average voltage at the accumulate line into a digital value in response to a set of (M+1) input synapse values at the (M+1) data input terminals and the activated first word line;
    wherein the average voltage is associated with the accumulation of the final amount of charge in each selected first bit line.

2. The device according to claim 1, wherein the average voltage is further associated with the selected number of the first bit lines and the capacitance for each first bit line.

3. The device according to claim 1, wherein when all of the first bit lines are connected to an accumulate line, the digital value r is defined by $r = \sum_{i=0}^{M} W_i * X_i$, where i denotes the synapse number of the artificial neuron and the total number of the artificial neuron's synapses is (M+1).

4. The device according to claim 1, further comprising:
    a capacitor;
    a current controller to receive the digital value and generate a control signal; and
    a charge pump having an output terminal coupled to the capacitor, wherein the charge pump receives the control signal to adjust a bias voltage at the output terminal and to provide the constant current for the output terminal.

5. The device according to claim 4, wherein each input circuit comprises a digital to analog converter (DAC) coupled to the output terminal of the charge pump, wherein the DAC charges its predefined first bit line according to its input synapse value $X_i$, the constant current and the bias voltage.

6. The device according to claim 5, wherein the DAC comprises:
    a digital to time converter to generate a pulse signal with a pulse width related to a mantissa of its input synapse value $X_i$ in its floating-point representation; and
    a time to analog converter to charge the predefined first bit line with a magnitude of current in response to the pulse signal, wherein the magnitude of current is related to a magnitude of the constant current and an exponent of its input synapse value $X_i$ in its floating-point representation.

7. The device according to claim 1, wherein the evaluation circuitry comprises:
    an analog to digital converter (ADC) coupled to the accumulation line and one of the first bit lines, wherein the ADC compares the average voltage at the accumulation line and a reference voltage at the one of the first bit lines to generate the digital value;
    wherein the reference voltage is formed by charging the one of the first bit lines based on the constant current.

8. The device according to claim 7, wherein the ADC comprises:
    an analog to time converter (ATC) to compare the average voltage and the reference voltage in a flip-flop manner to generate a rectangular voltage pulse with a first pulse on period and a second pulse on period; and
    a time to digital converter (TDC) to generate the digital value according to a difference between the first pulse on period and the second pulse on period;
    wherein the first pulse on period corresponds to a first time period that it takes for the reference voltage to increase from the ground voltage to the average voltage; and
    wherein the second pulse on period corresponds to a second period that it takes for the accumulation line to be charged from the average voltage to a maximum voltage.

9. The device according to claim 8, wherein the ATC comprises a sense amplifier with an input offset voltage, and the input offset voltage is cancelled after the TDC performs a subtraction operation over the first pulse on period and the second pulse on period.

10. The device according to claim 1, further comprising:
    an accumulation circuit to receive the digital value, calculate an accumulate value and output one of the digital value and the accumulate value according to a control signal, wherein the accumulate value is calculated based on a second product of the digital value and a first predefined weight associated with the activated first word line and a third product of its previous digital value and a second predefined weight associated with its previously activated first word line.

11. The device according to claim 1, wherein the predefined ratio is one of a binary-weighted ratio, a uniform-weighted ratio and a hybrid ratio.

12. The device according to claim 11, wherein the pre-defined ratio is related to the bit length of the weight values, and an output voltage of each input circuit is adjustable according to the bit length of the weight values.

13. The device according to claim 1, wherein the array of memory cells is one of an array of 6T SRAM cells, an array of 8T SRAM cells and an array of 10T SRAM cells.

14. The device according to claim 1, further comprising:
a plurality of second word lines arranged corresponding to the respective memory cell rows, each connected to the memory cells in a corresponding row
a plurality of second bit line pairs arranged corresponding to the respective memory cell columns, each connected to the memory cells in a corresponding column;
a second wordline driver to activate one of the second word lines to control reading and writing to the memory cells in a corresponding row; and
a column peripheral circuit coupled to the second bit line pairs and operable to control selecting columns of the array for reading and writing to the memory cells in the columns;
wherein an access to the memory cells for reading and writing is able to be conducted concurrently with an access to the memory cells for producing the digital value.

15. The device according to claim 14, wherein each memory cell comprises:
a SRAM cell comprising a latch and coupled to its corresponding second word line and its corresponding second bit line pairs;
a first transistor coupled to its corresponding first bit line, a gate electrode of which is connected to an output node of the latch; and
a second transistor coupled between the first transistor and a ground node, a gate electrode of which is connected to its corresponding first word line;
wherein when the first transistor is switched on by a bit value stored in the latch and its corresponding first word line is activated, its corresponding first bit line is discharged to the ground.

16. An in-memory computing memory block applied in an artificial neuron, comprising:
Q1 in-memory computing (IMC) memory devices of claim 1 that are arranged in a matrix of Q2 rows and Q3 columns, where Q1>1, Q2>0 and Q3>0.

17. The memory block according to claim 16, wherein when Q3=1, the (M+1) data input terminals of the Q1 IMC memory devices are respectively coupled together so as to receive the set of (M+1) input synapse values at the same time.

18. The memory block according to claim 16, wherein when Q2=1, (M+1)×Q3 data input terminals of the Q1 IMC memory devices in a row are used in combination to receive a set of (M+1)×Q3 input synapse values so that a total number of the artificial neuron's synapses is increased to (M+1)×Q3.

19. The memory block according to claim 16, wherein when Q2>1 and Q3>1, the (M+1) data input terminals of the Q2 IMC memory devices in each column are respectively coupled together so that the Q2 IMC memory devices in each column receive the set of (M+1) input synapse values at the same time.

20. The memory block according to claim 19, wherein (M+1)×Q3 data input terminals for the Q3 columns of the IMC memory devices are used in combination to receive a set of (M+1)×Q3 input synapse values so that a total number of the artificial neuron's synapses is increased to (M+1)×Q3.

21. The memory block according to claim 19, wherein the IMC memory devices in a column are configured to store the weight values with the same pre-defined bit length.

* * * * *